United States Patent

Gotou

(10) Patent No.: US 9,647,530 B2
(45) Date of Patent: May 9, 2017

(54) SWITCHING POWER SUPPLY WITH PREVENTIVE MAINTENANCE FUNCTION

(71) Applicant: FANUC Corporation, Yamanashi (JP)

(72) Inventor: Kazuya Gotou, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/163,673

(22) Filed: May 25, 2016

(65) Prior Publication Data

US 2016/0352212 A1   Dec. 1, 2016

(30) Foreign Application Priority Data

May 26, 2015   (JP) ................. 2015-106033

(51) Int. Cl.
| | |
|---|---|
| G05F 1/00 | (2006.01) |
| G05F 1/565 | (2006.01) |
| G05F 1/569 | (2006.01) |
| G05F 1/571 | (2006.01) |
| H02M 1/32 | (2007.01) |
| H02M 3/04 | (2006.01) |
| H02M 1/00 | (2006.01) |

(52) U.S. Cl.
CPC .............. H02M 1/32 (2013.01); H02M 3/04 (2013.01); *H02M 2001/0003* (2013.01)

(58) Field of Classification Search
CPC . G05F 1/462; G05F 1/56; G05F 1/562; G05F 1/563; G05F 1/565; G05F 1/569; G05F 1/575; G05F 1/595; G05F 1/61

USPC ........ 323/241–243, 246, 266, 274–276, 280, 323/284–286
See application file for complete search history.

(56) References Cited

U.S. PATENT DOCUMENTS

| | | | | |
|---|---|---|---|---|
| 7,834,598 | B1 * | 11/2010 | Wortham | H02M 1/32 323/224 |
| 8,410,768 | B2 * | 4/2013 | Huber | H02M 3/156 323/284 |
| 2012/0153919 | A1 * | 6/2012 | Garbossa | H02M 3/156 323/284 |
| 2012/0242308 | A1 * | 9/2012 | Adeeb | H02M 1/32 323/274 |

FOREIGN PATENT DOCUMENTS

| | | |
|---|---|---|
| JP | 2-145977 A | 6/1990 |
| JP | 5-56629 A | 3/1993 |
| JP | 2001-275344 A | 10/2001 |
| JP | 2002-153064 A | 5/2002 |
| JP | 2005-172653 A | 6/2005 |

* cited by examiner

*Primary Examiner* — Adolf Berhane
*Assistant Examiner* — Gary Nash
(74) *Attorney, Agent, or Firm* — Hauptman Ham, LLP

(57) ABSTRACT

A switching power supply is designed so that a switching frequency deviates from a predetermined range before an output voltage deviates from a predetermined voltage range due to degradation of a choke coil and an output capacitor. The switching power supply designed in that manner is provided with a switching frequency monitoring unit which monitors a switching waveform. By checking if the operating frequency is within a predetermined tolerance, it is determined whether the switching power supply is normally operating or not.

3 Claims, 2 Drawing Sheets

SWITCHING POWER SUPPLY WITH PREVENTIVE MAINTENANCE FUNCTION

RELATED APPLICATIONS

The present application claims priority to Japanese Patent Application Number 2015-106033, filed May 26, 2015, the disclosure of which is hereby incorporated by reference herein in its entirety.

BACKGROUND OF THE INVENTION

Field of the Invention

The present invention relates to a switching power supply, and more particularly, to a switching power supply with a preventive maintenance function to detect a power supply operation destabilized before a reduction in output voltage.

Description of the Related Art

A switching power supply outputs a constant voltage mainly by pulse width modulation (PWM) control. The following is a description of some prior art examples for detecting an abnormality in a power supply circuit comprising the switching power supply of this type.

First Prior Art Example

For example, Japanese Patent Applications Laid-Open Nos. 02-145977 and 2005-172653 disclose how to detect an abnormality in a power supply circuit including a switching power supply by an output voltage monitoring circuit incorporated in the power supply circuit. According to this prior art technique, as shown in FIG. 4, an output voltage is monitored by the voltage monitoring circuit in the power supply so that an abnormality in the power supply can be systematically recognized.

Second Prior Art Example

For example, Japanese Patent Application Laid-Open No. 05-056629 discloses a technique for estimating a remaining life by applying an operation status to an estimation model for estimating the degree of progress of degradation (life).

Third Prior Art Example

Japanese Patent Applications Laid-Open Nos. 2002-153064 and 2001-275344 disclose a switching power supply circuit configured so that an abnormality in the power supply circuit is detected if a value (such as a switching frequency) obtained by monitoring a switching waveform of a switching power supply deviates from a predetermined threshold range.

However, the above-described prior art examples have the following problems.

In the first prior art example, if the output voltage deviates from the monitored voltage due to aging degradation of an output capacitor or the like, the abnormality can be detected by the power supply circuit comprising the voltage monitoring circuit. If the threshold of the monitored voltage is low, however, a period from the detection of the abnormality to the occurrence of a failure is so short, as shown in FIG. 5, that the operation may be suddenly interrupted if preparation of a replacement part is delayed.

If the threshold of the monitored voltage is increased more than necessary, a normal operation period becomes so short, as shown in FIG. 5, that the costs increase as a side effect, though the necessary period from the detection of the abnormality to the occurrence of the failure can be secured for the preparation of the replacement part or the like.

There is also a problem that the voltage monitoring IC in the power supply circuit performs monitoring on a DC level, so that it is necessary to separately provide a structure for monitoring a ripple voltage that influences the power supply precision.

In the second prior art example, as a model reflective of an actual circuit state is not used, this technique is applicable to an situation where an estimation model is applicable, but in a case where a degradation mode different from the estimation model is caused, a failure occurs during a period shorter than the estimated remaining life, resulting in a sudden interruption of the operation.

In the third prior art example, moreover, the switching power supply of an insulating AC-DC converter is assumed to be an object of switching frequency monitoring. Since this insulating AC-DC converter is a high-power application, components are quickly degraded. If the operation (characteristic) of the switching power supply after occurrence of abnormality in the switching frequency is not set, as in this prior art example, it is difficult to set a monitoring threshold with a period from the detection of the abnormality in the switching frequency to the occurrence of an output power supply abnormality properly secured. Thus, an advantageous effect of preventive maintenance of this example is low.

SUMMARY OF THE INVENTION

Accordingly, the object of the present invention is to provide a switching power supply capable of detecting an unstable power supply operation before an output voltage is reduced.

A switching power supply according to the present invention comprises a power supply control unit configured to output a PWM waveform for controlling an input voltage to be a constant output voltage, a choke coil and an output capacitor configured to smooth the PWM waveform output by the power supply control unit, a switching frequency monitoring unit configured to measure a switching frequency of the PWM waveform, and an alarm output unit configured to determine whether or not the switching frequency measured by the switching frequency monitoring unit is within a predetermined frequency range and output a preventive maintenance alarm if the switching frequency is not within the range. The power supply control unit is configured to perform control such that the switching frequency deviates from the predetermined frequency range before the output voltage deviates from a predetermined voltage range due to degradation of the choke coil and the output capacitor.

The switching power supply may further comprise an output voltage monitoring unit configured to monitor the output voltage, and the alarm output unit may be configured to determine whether or not the output voltage measured by the output voltage monitoring unit is within the predetermined voltage range and output a device changing alarm if the output voltage is not within the range.

According to the present invention, an operation as an indication of a failure of an actual circuit acts as a trigger, so that preventive maintenance reflective of a circuit state can be performed and there is no possibility of a side effect occurring due to setting of an inappropriate threshold peculiar to the prior art.

Further, a period from the detection of an abnormality to the occurrence of a failure can be secured by using the switching power supply in which an abnormal output voltage occurs after the occurrence of an abnormal switching frequency. Furthermore, a device can be changed at the time of the occurrence of the abnormal output voltage, so that the maintenance period can be extended.

BRIEF DESCRIPTION OF THE DRAWINGS

The above and other objects and features of the present invention will be obvious from the ensuing description of embodiments with reference to the accompanying drawings, in which.

DETAILED DESCRIPTION OF THE PREFERRED EMBODIMENTS

Figure 1:
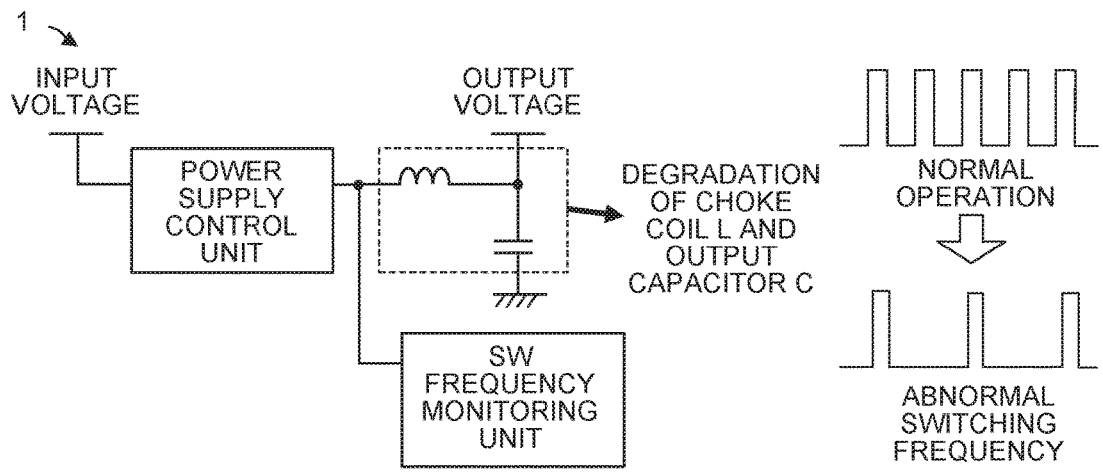
FIG. 1 is a diagram illustrating an outline of the function of a switching power supply according to the present invention.

An outline of the function of a switching power supply according to the present invention will be described with reference to FIG. 1.

The switching power supply according to the present invention is designed so that its switching frequency deviates from a predetermined frequency range before its output voltage deviates from a predetermined voltage range due to degradation of a choke coil and an output capacitor.

In the present invention, the switching power supply designed as described above is provided with a switching frequency monitoring unit, which monitors a switching waveform to check if the operating frequency is within a predetermined tolerance, thereby determining whether or not the switching power supply is normally operating.

The switching power supply used in the present invention, as described above, is designed so that its output voltage is not considerably reduced (or changed) at once even in case the switching waveform is disturbed so that the operating frequency fluctuates due to the characteristics of the power supply. Therefore, detection of fluctuations of the switching waveform acts as a trigger for preventive maintenance.

Figure 2:
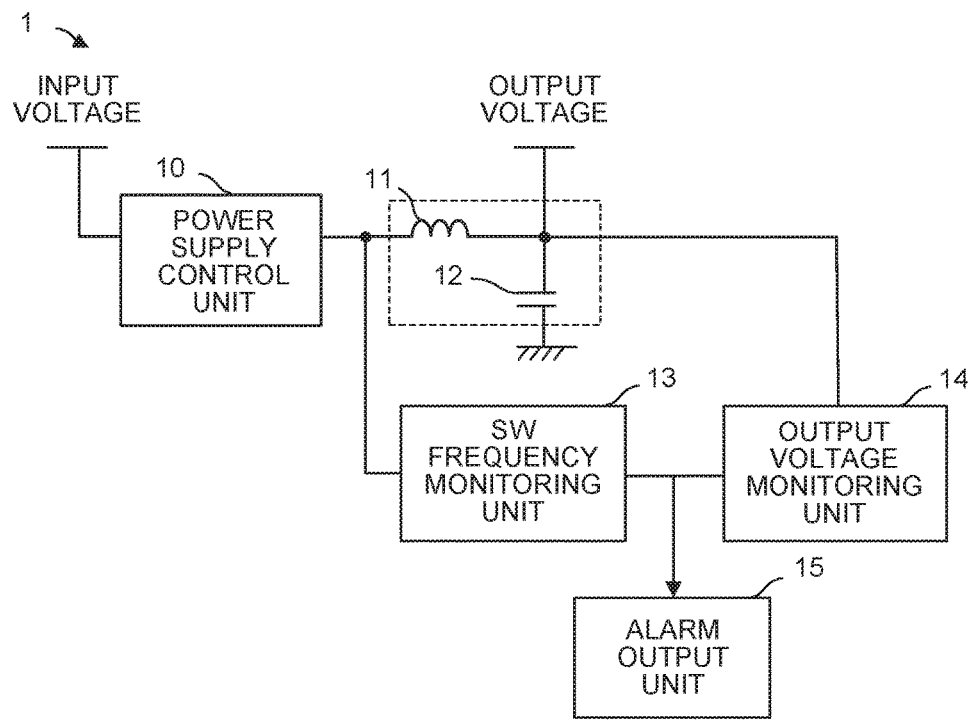
FIG. 2 is a schematic configuration diagram of a switching power supply according to one embodiment of the invention.

A schematic configuration of a switching power supply according to one embodiment of the present invention will be described with reference to FIG. 2.

A switching power supply 1 comprises a power supply control unit 10, choke coil 11, output capacitor 12, switching frequency monitoring unit 13, output voltage monitoring unit 14, and alarm output unit 15.

The power supply control unit 10 performs pulse width modulation (PWM) control of an input voltage and outputs a switching waveform signal. In the power supply control unit 10, its output signal is controlled so that its switching frequency deviates from a predetermined frequency range before its output voltage deviates from a predetermined voltage range due to degradation of the choke coil 11 and the output capacitor 12. This output signal control by the power supply control unit 10 is performed by adjusting constants of a phase compensation circuit built in the power supply control unit 10.

Figure 3:
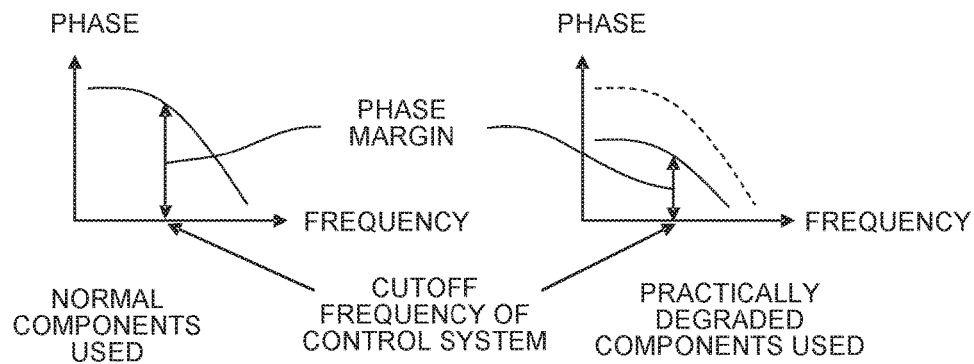
FIG. 3 is a diagram illustrating characteristics of the switching power supply according to the invention.
Figure 4:
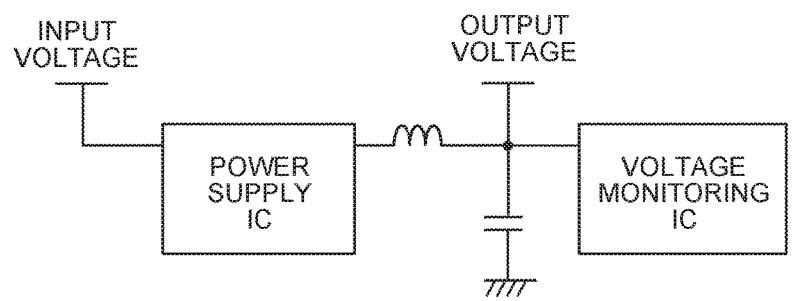
FIG. 4 is a schematic configuration diagram of a prior art switching power supply.
Figure 5:
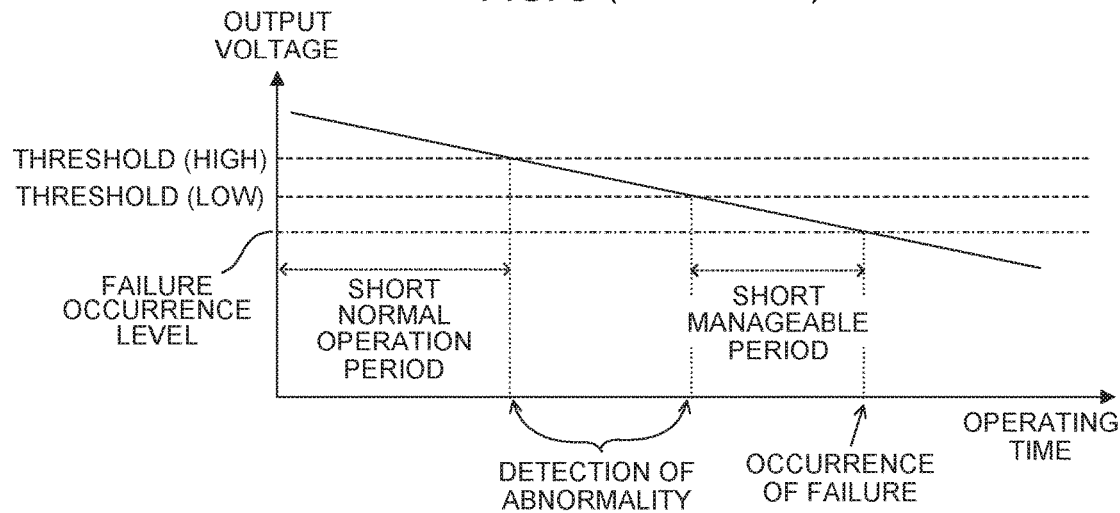
FIG. 5 is a diagram illustrating problems of the prior art switching power supply.

As shown in FIG. 3, for example, the constants of the phase compensation circuit are adjusted so that the choke coil and the output capacitor in use have an appropriate phase margin if they have normal characteristic values ("normal components used") and that their phase margin is reduced if they are degraded and have abnormal characteristic values ("practically degraded components used"). Also, the choke coil and the output capacitor are designed so that the switching frequency deviates from the predetermined range if they are degraded. If the power supply control unit 10 is a digital control unit, control parameters such as PID parameters are adjusted in the same manner.

The choke coil 11 and the output capacitor 12 serve as an output filter (smoothing circuit) for the switching waveform signal output from the power supply control unit 10 and output a smoothed output voltage.

The time constant ($\sqrt{LC}$) of the low-pass filter comprising the choke coil and the output capacitor is made higher with respect to the switching frequency with disturbed switching waveform so that the output voltage is not considerably reduced (or changed) despite the disturbance of the switching waveform. For example, the time constant of the low-pass filter is designed so that the switching frequency when the switching waveform signal is disturbed is more than ten times as high as the cutoff frequency ($1/2\pi\sqrt{LC}$) of the low-pass filter.

The switching frequency monitoring unit 13 monitors the switching waveform signal output from the power supply control unit 10 and determines whether or not the switching frequency of the switching waveform signal is within the predetermined range. If the switching frequency deviates from the predetermined range, the monitoring unit 13 instructs the alarm output unit 15 to output a preventive maintenance alarm. The switching frequency monitoring unit 13 comprises a CPU, memory, DSP, and the like.

The output voltage monitoring unit 14 monitors the output voltage of the switching power supply and determines whether or not the output voltage is within the predetermined voltage range. If the output voltage deviates from the predetermined range, the monitoring unit 14 instructs the alarm output unit 15 to output a device changing alarm. The output voltage monitoring unit 14 comprises a comparator circuit or the like for comparison with preset maximum and minimum voltage values $V_H$ and $V_L$, and the like.

The alarm output unit 15 outputs the preventive maintenance alarm or the device changing alarm in response to a preventive maintenance alarm outputting command from the switching frequency monitoring unit 13 or a device changing alarm output command from the output voltage monitoring unit 14. The output alarm may be a visual alarm, such as an LED alarm, or an audio alarm. In short, any output form may be used only if a user can distinguish between individual alarms.

While an embodiment of the present invention has been described herein, the invention is not limited to the above-described embodiment and may be suitably modified and embodied in various forms.

The invention claimed is:

1. A switching power supply, comprising:
   a power supply control unit configured to output a PWM waveform for controlling an input voltage to be a constant output voltage; and
   a choke coil and an output capacitor configured to smooth the PWM waveform output by the power supply control unit,
   the switching power supply further comprising:
   a switching frequency monitoring unit configured to measure a switching frequency of the PWM waveform; and
   an alarm output unit configured to determine whether or not the switching frequency measured by the switching frequency monitoring unit is within a predetermined frequency range and output a preventive maintenance alarm if the switching frequency is not within the range, wherein the power supply control unit is configured to perform control such that the switching frequency deviates from the predetermined frequency range before the output voltage deviates from a predetermined voltage range due to degradation of the choke coil and the output capacitor.

2. The switching power supply according to claim 1, further comprising an output voltage monitoring unit configured to monitor the output voltage, wherein the alarm output unit is configured to determine whether or not the output voltage measured by the output voltage monitoring unit is within the predetermined voltage range and output a device changing alarm if the output voltage is not within the range.

3. The switching power supply according to claim 1, wherein the power supply control unit comprises a built-in phase compensation circuit and the control by the power supply control unit is performed by adjusting constants of the phase compensation circuit.

* * * * *